(12) United States Patent  
Mebarki et al.

(10) Patent No.: US 10,049,927 B2  
(45) Date of Patent: Aug. 14, 2018

(54) SEAM-HEALING METHOD UPON SUPRA-ATMOSPHERIC PROCESS IN DIFFUSION PROMOTING AMBIENT

(71) Applicant: Applied Materials, Inc., Santa Clara, CA (US)

(72) Inventors: Bencherki Mebarki, Santa Clara, CA (US); Sean Kang, San Ramon, CA (US); Keith Tatseun Wong, Mountain View, CA (US); He Ren, San Jose, CA (US); Mehul B. Naik, San Jose, CA (US); Ellie Y. Yieh, San Jose, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 5 days.

(21) Appl. No.: 15/332,737

(22) Filed: Oct. 24, 2016

(65) Prior Publication Data

US 2017/0358490 A1    Dec. 14, 2017

Related U.S. Application Data

(60) Provisional application No. 62/348,547, filed on Jun. 10, 2016.

(51) Int. Cl.
```
H01L 21/76      (2006.01)
H01L 21/768     (2006.01)
H01L 23/532     (2006.01)
```
(52) U.S. Cl.  
CPC .. *H01L 21/76882* (2013.01); *H01L 21/76883* (2013.01); *H01L 23/53209* (2013.01); *H01L 23/53214* (2013.01); *H01L 23/53257* (2013.01)

(58) Field of Classification Search  
CPC .................................................. H01L 21/4763  
See application file for complete search history.

(56) References Cited

U.S. PATENT DOCUMENTS

| | | | | |
|---|---|---|---|---|
| 5,747,383 A | * | 5/1998 | Chen ................ | H01L 21/76877 257/E21.585 |
| 6,071,810 A | * | 6/2000 | Wada ................ | H01L 21/2855 257/E21.169 |
| 6,334,249 B2 | | 1/2002 | Hsu | |

(Continued)

FOREIGN PATENT DOCUMENTS

| | | |
|---|---|---|
| EP | 0516344 A1 | 12/1992 |
| EP | 1069213 A2 | 1/2001 |
| WO | 2015/195081 A1 | 12/2015 |

OTHER PUBLICATIONS

T. Miyake et al., "Effects of atomic hydrogen on Cu reflow process", AIP Conferenec Proceedings 418, 419 (1998).

(Continued)

*Primary Examiner* — Caridad Everhart  
*Assistant Examiner* — Ankush Singal  
(74) *Attorney, Agent, or Firm* — Patterson + Sheridan, LLP

(57) ABSTRACT

Aspects of the disclosure include methods of treating a substrate to remove one or more of voids, seams, and grain boundaries from interconnects formed on the substrate. The method includes heating the substrate in an environment pressurized at supra-atmospheric pressure. In one example, the substrate may be heated in a hydrogen-containing atmosphere.

20 Claims, 2 Drawing Sheets

(56) References Cited

U.S. PATENT DOCUMENTS

| | | | |
|---|---|---|---|
| 6,399,486 | B1 | 6/2002 | Chen et al. |
| 7,465,650 | B2 * | 12/2008 | Derderian ......... H01L 21/76877 |
| | | | 257/E21.046 |
| 7,964,506 | B1 * | 6/2011 | Ponnuswamy .......... C25D 3/38 |
| | | | 257/E21.311 |
| 2001/0055649 | A1 * | 12/2001 | Ogure .................... C23C 16/18 |
| | | | 427/248.1 |
| 2005/0227479 | A1 | 10/2005 | Feng et al. |
| 2009/0087981 | A1 * | 4/2009 | Suzuki .............. H01L 21/28518 |
| | | | 438/643 |
| 2012/0138146 | A1 * | 6/2012 | Furuhata ........... H01L 31/02366 |
| | | | 136/259 |
| 2015/0093891 | A1 | 4/2015 | Zope et al. |
| 2015/0357195 | A1 | 12/2015 | Lam et al. |
| 2016/0186363 | A1 * | 6/2016 | Merzaghi .............. C23C 16/279 |
| | | | 74/434 |
| 2016/0358815 | A1 * | 12/2016 | Yu ....................... H01L 23/5226 |

OTHER PUBLICATIONS

International Search Report and Written Opinion dated Aug. 24, 2017 for Application No. PCT/US2017/033862.

\* cited by examiner

SEAM-HEALING METHOD UPON SUPRA-ATMOSPHERIC PROCESS IN DIFFUSION PROMOTING AMBIENT

CROSS-REFERENCE TO RELATED APPLICATIONS

This application claims benefit of U.S. Provisional Patent Application Ser. No. 62/348,547, filed Jun. 10, 2016, which is herein incorporated by reference.

BACKGROUND

Field

Embodiments of the present disclosure generally relate to integrated circuit fabrication methods, and in particular, to correcting seam defects in trenches or vias.

Description of the Related Art

Many obstacles exist in the further miniaturization of semiconductor components. One such obstacle is the filling of metal interconnects, which affects the yield of modern CMOS devices. Metal interconnect signal lines make contact to lower conductive layers of the integrated circuit through vias that are formed in an insulating layer. It is desirable to fill the contact and interconnect with the metal that is used to form the interconnect layer so as to insure optimal operation of the device.

Conductive metals, such as copper, are presently the materials of choice for the fabrication of interconnect lines in integrated circuits. Conventional techniques used to fill interconnect lines generally include physical vapor deposition (PVD) or atomic layer deposition (ALD) of a barrier material, followed by a liner and then either copper reflow or electroplating.

When using conventional techniques, problems arise in the interconnect lines from the accumulation of relatively large grains of material at the upper surface of an insulating layer, as well as the accumulation of impurities within the conductive bulk. The accumulation of such grains at the edges of the contact via or interconnect can block or otherwise obstruct the contact or interconnect prior to completely filling the contact or interconnect, resulting in the formation of voids, seems, and uneven structures within the contact or interconnect. The aforementioned problem is particularly acute as integrated circuits are fabricated using smaller geometries.

The smaller contacts that are used in smaller geometry devices, such as contacts or interconnects in the tens of nanometers or less range, necessarily have a larger aspect ratio (i.e., relationship of feature height to width) than do larger geometry devices, thereby exacerbating the contact- or interconnect-filling difficulties described above. For example, unduly large voids can result in line resistance and contact resistance that are appreciably higher than designed. In addition, thinner regions of the conductive material adjacent to the contact or interconnect fill region will be subject to electro migration, which can result in the eventual opening of the circuits and failure of the device.

To address the above issues, other materials and deposition techniques have been considered. When using other fill techniques such as chemical vapor deposition (CVD), cyclical deposition/treat processes are employed. One approach utilizes multiple cycles of deposition and anneal in attempt to repair seams and cavities in the conductive material in low-to-sub atmospheric pressures process regimes. This approach results in extremely slow process time, and attempts to reduce process time have resulted in unsatisfactory resistivity. In other approaches, the deposited metal is subjected to extremely high pressures, such as 700 bar to 2000 bar, or more, in attempt to repair defects in the conductive material. The exerted pressure forces the deposited metal into the undesired voids within the deposited film. However, subsequent thermal post treatment to correct grain boundary defects or other defects results in partial or full reformation of the void. In addition, the pressures utilized in conventional approaches may result in physical damage to low-k dielectric materials adjacent the interconnect.

Therefore, this is a need for an improved method of correcting seam defects.

SUMMARY

In one embodiment, a method of treating a substrate comprises positioning the substrate in a process chamber, the substrate having a interconnect formed thereon, the interconnect including a conductive material having one or more of a seam or a void therein; heating the substrate to a temperature of about 300 degrees Celsius to about 400 degrees Celsius; and exposing the substrate to hydrogen-containing atmosphere at a pressure of about 12 bar to about 50 bar.

In another embodiment, a method of treating a substrate comprises positioning the substrate in a process chamber, the substrate having a interconnect formed thereon, the interconnect including a conductive material having one or more of a seam or a void therein; heating the substrate to a temperature of about 250 degrees Celsius to about 400 degrees Celsius; and exposing the substrate to hydrogen-containing atmosphere at a pressure of about 12 bar to about 50 bar.

In another embodiment, a method of treating a substrate comprises forming an interconnect on a substrate, the interconnect including a conductive material having one or more of a seam or a void therein; after forming the interconnect, healing the one or more of a seam or a void, the healing comprising: heating the substrate to a temperature of about 250 degrees Celsius to about 400 degrees Celsius; and exposing the substrate to hydrogen-containing atmosphere at a pressure of about 12 bar to about 20 bar.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the FIGURES. It is contemplated that elements and features of one embodiment may be beneficially incorporated in other embodiments without further recitation.

DETAILED DESCRIPTION

Aspects of the disclosure include methods of treating a substrate to remove one or more of voids, seams, or grain boundaries from an interconnect formed on the substrate. The method includes heating the substrate in an environment pressurized at a pressure of about 1 bar to about 50 bar.

Figure 1:
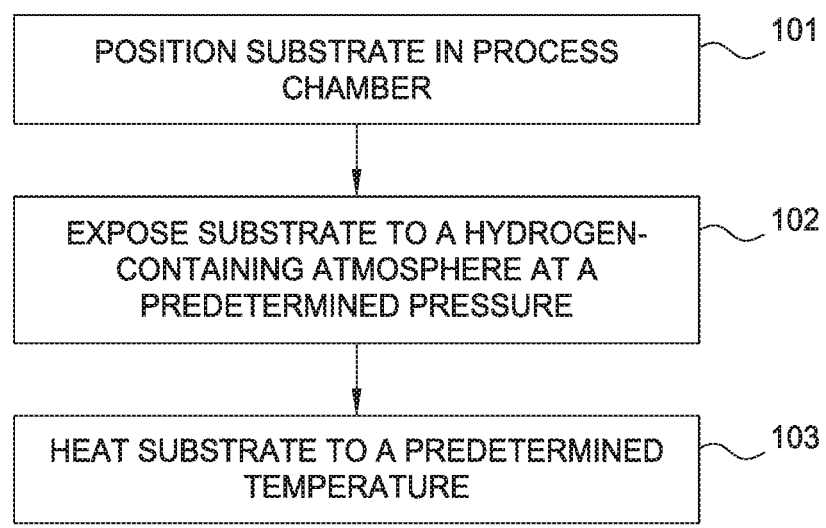
FIG. 1 is a flow diagram of a method for processing a substrate, according to one embodiment of the disclosure.
Figure 2A:
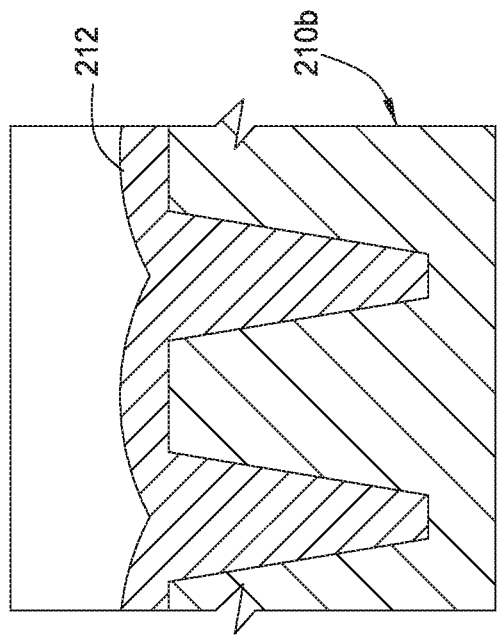
FIG. 2A is a schematic sectional view a substrate having interconnects that include one or more defects from a gap-fill process.
Figure 2B:
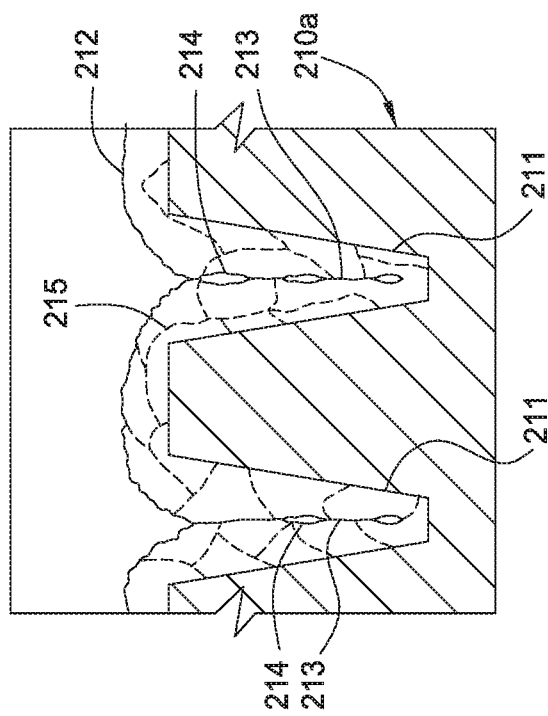
FIG. 2B is a schematic sectional view of the substrate of FIG. 2A after processing according to embodiments described herein.

FIG. 1 is a flow diagram of a method 100 for processing a substrate, according to one embodiment of the disclosure. FIG. 2A is a schematic sectional view a substrate having interconnects that include one or more defects from a gap-fill process. FIG. 2B is a schematic sectional view of the substrate of FIG. 2A after processing according to embodiments described herein. To facilitate explanation of aspects of the disclosure, FIGS. 2A and 2B will be explained in conjunction with FIG. 1.

Method 100 begins at operation 101. In operation 101, a substrate 210 is positioned in a process chamber. The substrate 210 includes one or more trenches 211 (two are shown) having a conductive material 212 deposited therein to form interconnects. The conductive material 212 is a metal, such as cobalt, copper, ruthenium, or aluminum, which may be deposited by CVD, PVD, ALD, plating, or other deposition methods. During deposition of the conductive material 212, one or more of a seam 213, a void 214, or grain boundaries 215 may form. The seams 213, the voids 214, and the grain boundaries 215 negatively affect performance of the interconnects by increasing electrical resistance of the interconnects.

In operation 102, the substrate 210 is exposed to a hydrogen-containing atmosphere at a predetermined pressure. The hydrogen-containing environment includes hydrogen gas and one or more non-reactive gases, such as diatomic nitrogen or argon. Hydrogen is present within a range of about 1 atomic percent to about 100 atomic percent, such as about 1 atomic percent to about 10 atomic percent, for example, about 2 atomic percent to about 5 atomic percent or about 3.5 atomic percent to about 4.5 atomic percent. In one example, hydrogen is present at about 4 atomic percent. It is contemplated that a lower atomic percentage of hydrogen may dictate longer processing times or elevated temperatures, while higher atomic percentages of hydrogen may dictate the use of additional hardware, such as interlocks. In another example, deuterium may be used in place of, or in combination with, hydrogen in the atomic percentages described above.

The presence of hydrogen in the atmosphere of the process chamber weakens the surface bounds of the conductive material 212 to facilitate flow of the conductive material 212 into the voids 214. A supra-atmospheric pressure (e.g., a pressure greater than atmospheric pressure) is maintained in the process chamber while exposing the substrate 210 to the hydrogen-containing environment. In one example, the pressure within the process chamber is maintained within a range of about 1 bar to about 50 bar, such as about 1 bar to about 20 bar, for example about 5 bar to about 15 bar. In another example, the pressure within the process chamber is maintained within a range of about 12 bar to about 50 bar, such as about 12 bar to about 20 bar, for example about 12 bar to about 15 bar. The application of increased pressure in the presence of the hydrogen-containing environment facilitates movement of the conductive material 212 into the voids 214. In addition, the application of increased pressure may facilitate introduction of hydrogen into seam 213, the void 214, or even along the grain boundary 215, to remove contaminants trapped therein. Contaminants may be present as a result of the deposition process of the conductive material 212, or from sources within the process chamber. The presence of the contaminants within the conductive material 212 may further increase electrical resistance.

In operation 103, the substrate 210 is heated to a predetermined temperature. In one example, the predetermined temperature is about 250 degrees Celsius to about 400 degrees Celsius, such as about 300 degrees Celsius to about 400 degrees Celsius, for example, 400 degrees Celsius. It is contemplated that temperatures above about 400 degrees Celsius may adversely the structure of the substrate 210 adjacent to the conductive material 212. For example, excess temperatures may physically disrupt material adjacent the conductive material 212, resulting in leakage of electrical current. In one example, the temperature of the substrate remains below the melting point of the conductive material 212. Even though the melting point of the conductive material 212 may not be reached in aspects described herein, the elevated temperature in the presence of the elevated pressure and the hydrogen gas still facilitates atomic movement of the conductive material 212. Thus, filling of the voids 214 is promoted.

The increased temperature, in combination with the increased pressure and the hydrogen-containing environment, facilitate movement of the conductive material 212 into voids 214, while simultaneously healing or repairing any seams 213, reducing grain boundaries 215, and increasing grain size. The removal of seams 213, voids 214, and grain boundaries 215 occurs in a single operation after complete deposition of the conductive material 212.

In contrast, one known approach uses cyclical treatment/deposition processes, in which a small amount of material is deposited in a trench, such as about 20 angstroms to about 100 angstroms, and then the material is treated. This previously-attempted approach is very inefficient and time consuming due to the number of processes required. In addition, the treatment process of such an approach is a multiple step process, further increasing the number of operations which are performed.

In the multi-cycle treatment process, the substrate is first exposed to high temperatures to weaken the conductive material and merge grains through multi-iteration deposition and treatment cycles, which is very time consuming. Alternatively, the conductive material is subjected to high temperatures after subjecting the conductive material to high pressures (to close a void), which allows the voids to reopen or reform. The very high pressures utilized in previous approaches result in damage to the substrate adjacent the conductive material, due to the excessive force applied to the conductive material and transferred to the substrate.

However, the inventors of the present disclosure have discovered that pressures within a range of about 1 bar to about 50 bar or about 12 bar to about 50 bar, such as ab out 12 bar to 20 bar, in combination with simultaneous elevated temperatures and hydrogen gas, provides significant improvements over existing approaches. Specifically, seams and voids are repaired, and grain boundaries are reduced, in a single operation which does not subject the substrate 210 to undesirably elevated pressures. Notably, the pressure within a void 214 is about $1 \times 10^{-8}$ bar when formed by a PVD process, and the inventors have determined that a pressure within a range of about 1 bar to about 50 bar, such as about 12 bar to about 50 bar, for example about 12 bar to about 20 bar, is sufficient to facilitate repair of seams 213 and voids 214. Thus, the extremely high pressures of conventional approaches, and the undesired consequences thereof, are avoided by aspects of the disclosure. Additionally, unlike existing approaches, the aspects described herein can repair seam, void, and grain defects after completely depositing the conductive material 212. Thus, aspects described herein are not subject to cyclical deposition-treatment, resulting in reduced process time per substrate.

FIG. 2B schematically illustrates the substrate 210 after operation 103. As illustrated, method 100 has removed the grain boundaries 215, resulting in a single grain structure. Additionally, method 100 has also removed the seams 213 and the voids 214. The resulting conductive material 212 has a lower resistance than the conductive material illustrated in FIG. 2A.

FIG. 1 illustrates one embodiment of treating a substrate; however, additional embodiments are also contemplated. In another aspect, operations 102 and 103 may occur simultaneously or in reverse order. In another aspect, it is contemplated that process gases other than hydrogen may be utilized in operations 102, as long as the process gas does not undesirably react with the substrate 210 or the conductive material 212. In another example, the hydrogen gas may be excluded from operation 102. In such an example, the argon may facilitate reflow of the conductive material 212. However, due to the relatively larger size and reduced reactivity of argon compared hydrogen, argon may be less efficient than hydrogen at removing contaminants and weakening surface bonds of the conductive material 212.

Benefits of the aspects of the disclosure include reduced processing time since seams, voids, and grain boundaries can be corrected in a single operation, rather than in multiple cycles as occurs in existing processes. Additionally, aspects described herein can be performed using less expensive hardware as compared to hardware configured for significantly higher pressures, since significantly lower pressures are utilized in aspects of the disclosure. Additionally, the enhanced flow conditions of conductive metals when processed as described herein may facilitate the use of thinner liners, thus reducing materials expenses and allowing smaller geometries. In some instances, it is contemplated that the liner may be completely excluded. Aspects of the disclosure should not be limited to examples described herein, and may be applied to any instance of metal fill, such as 3D-NAND gate fill, CMOS logic gate fill, bit lines for memory devices, and the like.

While the foregoing is directed to embodiments of the present disclosure, other and further embodiments of the disclosure may be devised without departing from the basic scope thereof, and the scope thereof is determined by the claims that follow.

What is claimed is:

1. A method of treating a substrate, comprising:
    positioning the substrate in a process chamber, the substrate having a interconnect formed thereon, the interconnect including a conductive material having one or more of a seam or a void therein;
    heating the substrate to a temperature of about 300 degrees Celsius to about 400 degrees Celsius; and
    exposing the substrate to hydrogen-containing atmosphere at a pressure of about 12 bar to about 50 bar.

2. The method of claim 1, wherein the hydrogen-containing atmosphere includes hydrogen present within a range of about 3.5 atomic percent to about 4.5 atomic percent.

3. The method of claim 1, wherein the hydrogen-containing atmosphere further comprises diatomic nitrogen or argon.

4. The method of claim 1, wherein the hydrogen-containing atmosphere includes hydrogen present within a range of about 1 atomic percent to about 100 atomic percent.

5. The method of claim 1, further comprising healing the seam or void.

6. The method of claim 1, wherein the interconnect further comprises grain boundaries.

7. The method of claim 6, further comprising reducing the grain boundaries.

8. A method of treating a substrate, comprising:
    positioning the substrate in a process chamber, the substrate having a interconnect formed thereon, the interconnect including a conductive material having one or more of a seam or a void therein;
    heating the substrate to a temperature of about 250 degrees Celsius to about 400 degrees Celsius; and
    exposing the substrate to hydrogen-containing atmosphere at a pressure of about 12 bar to about 50 bar.

9. The method of claim 8, wherein the interconnect further comprises grain boundaries, and wherein the hydrogen-containing atmosphere has a pressure within a range of about 12 bar to about 20 bar.

10. The method of claim 9, wherein the hydrogen-containing atmosphere further comprises diatomic nitrogen or argon.

11. The method of claim 10, wherein the substrate is heated to a temperature within a range of about 300 degrees Celsius to about 400 degrees Celsius, and wherein the hydrogen-containing atmosphere has a pressure within a range of about 12 bar to about 15 bar.

12. The method of claim 11, wherein the hydrogen-containing atmosphere includes hydrogen present within a range of about 3.5 atomic percent to about 4.5 atomic percent.

13. The method of claim 12, further comprising reducing the grain boundaries.

14. The method of claim 13, further comprising healing the seam or void.

15. A method of treating a substrate, comprising:
    forming an interconnect on a substrate, the interconnect including a conductive material having one or more of a seam or a void therein;
    after forming the interconnect, healing the one or more of a seam or a void, the healing comprising:
        heating the substrate to a temperature of about 250 degrees Celsius to about 400 degrees Celsius; and
        exposing the substrate to hydrogen-containing atmosphere at a pressure of about 12 bar to about 20 bar.

16. The method of claim 15, wherein the hydrogen-containing atmosphere includes hydrogen present within a range of about 1 atomic percent to about 100 atomic percent.

17. The method of claim 16, wherein the hydrogen-containing atmosphere further comprises diatomic nitrogen, and wherein the hydrogen is present within a range of about 3.5 atomic percent to about 4.5 atomic percent.

18. The method of claim 17, wherein the substrate is heated to a temperature within a range of about 300 degrees Celsius to about 400 degrees Celsius.

19. The method of claim 16, wherein the hydrogen-containing atmosphere is driven into the seam or void via pressure to remove contaminants from within the seam or void.

20. The method of claim 19, wherein the substrate is heated to a temperature within a range of about 300 degrees Celsius to about 400 degrees Celsius.

\* \* \* \* \*